US011943877B2

(12) United States Patent
Lin et al.

(10) Patent No.: US 11,943,877 B2
(45) Date of Patent: Mar. 26, 2024

(54) CIRCUIT BOARD STRUCTURE AND MANUFACTURING METHOD THEREOF

(71) Applicant: Unimicron Technology Corp., Taoyuan (TW)

(72) Inventors: Wen-Yu Lin, Taichung (TW); Kai-Ming Yang, Hsinchu County (TW); Chen-Hao Lin, Keelung (TW); Pu-Ju Lin, Hsinchu (TW); Cheng-Ta Ko, Taipei (TW); Chin-Sheng Wang, Taoyuan (TW); Guang-Hwa Ma, Hsinchu (TW); Tzyy-Jang Tseng, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/684,421

(22) Filed: Mar. 2, 2022

(65) Prior Publication Data

US 2023/0240023 A1 Jul. 27, 2023

(30) Foreign Application Priority Data

Jan. 24, 2022 (TW) .................................. 111102869

(51) Int. Cl.
*H05K 3/24* (2006.01)
*H01L 21/56* (2006.01)
(Continued)

(52) U.S. Cl.
CPC .............. *H05K 3/467* (2013.01); *H05K 1/112* (2013.01); *H05K 2201/0191* (2013.01)

(58) Field of Classification Search
CPC ........ H05K 1/112; H05K 1/113; H05K 1/181; H05K 1/184; H05K 1/185; H05K 1/186;
(Continued)

(56) References Cited

U.S. PATENT DOCUMENTS 8,707,552 B2 * 4/2014 Kariya .................... H01L 23/50
29/25.42
9,875,957 B2 1/2018 Shimizu et al.
(Continued)

FOREIGN PATENT DOCUMENTS

CN 112086443 12/2020
TW 201513753 4/2015
(Continued)

OTHER PUBLICATIONS

"Office Action of Taiwan Counterpart Application", dated May 11, 2022, p. 1-p. 12.

*Primary Examiner* — Xiaoliang Chen
(74) *Attorney, Agent, or Firm* — JCIPRNET

(57) ABSTRACT

A circuit board structure includes a circuit substrate having opposing first and second sides, a redistribution structure disposed at the first side, and a dielectric structure disposed at the second side. The circuit substrate includes a first circuit layer disposed at the first side and a second circuit layer disposed at the second side. The redistribution structure is electrically coupled to the circuit substrate and includes a first leveling dielectric layer covering the first circuit layer, a first thin-film dielectric layer disposed on the first leveling dielectric layer and having a material different from the first leveling dielectric layer, and a first redistributive layer disposed on the first thin-film dielectric layer and penetrating through the first thin-film dielectric layer and the first leveling dielectric layer to be in contact with the first circuit layer. The dielectric structure includes a second leveling dielectric layer disposed below the second circuit layer.

6 Claims, 10 Drawing Sheets

(51) Int. Cl.
    *H01L 23/15*         (2006.01)
    *H01L 23/31*         (2006.01)
    *H01L 23/488*       (2006.01)
    *H01L 23/544*       (2006.01)
    *H05K 1/11*          (2006.01)
    *H05K 3/46*          (2006.01)

(58) Field of Classification Search
    CPC .......... H05K 1/188; H05K 3/24; H05K 3/145; H05K 3/429; H05K 3/462; H05K 3/467; H05K 3/488; H05K 3/4038; H05K 3/4602; H05K 3/4614; H05K 3/4623; H05K 2201/015; H05K 2201/037; H05K 2201/0191; H01L 21/56; H01L 21/486; H01L 21/561; H01L 21/565; H01L 23/15; H01L 23/31; H01L 23/145; H01L 23/481; H01L 23/488; H01L 23/544; H01L 23/642; H01L 23/645; H01L 24/06; H01L 24/08; H01L 24/11; H01L 24/16; H01L 24/17; H01L 24/19; H01L 24/32; H01L 24/33; H01L 24/45; H01L 24/48; H01L 24/81; H01L 24/97
    USPC ....... 174/262, 257; 438/667; 156/252, 272.8
    See application file for complete search history.

(56) References Cited

U.S. PATENT DOCUMENTS

| | | | | |
|---|---|---|---|---|
| 11,516,910 | B1* | 11/2022 | Peng | H05K 1/0296 |
| 2004/0040738 | A1* | 3/2004 | Tani | H05K 3/4641 |
| | | | | 174/250 |
| 2005/0218503 | A1* | 10/2005 | Abe | H01L 23/49822 |
| | | | | 257/700 |
| 2008/0289866 | A1* | 11/2008 | Yuri | H01L 23/49822 |
| | | | | 257/E23.079 |
| 2009/0294056 | A1* | 12/2009 | Yoshimura | H05K 3/4614 |
| | | | | 156/327 |
| 2009/0294160 | A1* | 12/2009 | Yoshimura | H05K 3/4614 |
| | | | | 252/514 |
| 2010/0230145 | A1* | 9/2010 | Holcomb | H05K 3/4614 |
| | | | | 174/257 |
| 2012/0119377 | A1* | 5/2012 | Muramatsu | H01L 23/49822 |
| | | | | 257/E21.585 |
| 2016/0073515 | A1* | 3/2016 | Shimizu | H05K 1/185 |
| | | | | 361/761 |
| 2019/0059153 | A1 | 2/2019 | Liu et al. | |
| 2019/0380210 | A1* | 12/2019 | Lin | H05K 3/4617 |
| 2019/0380212 | A1* | 12/2019 | Chien | H05K 3/4623 |
| 2019/0394877 | A1* | 12/2019 | Ishiguro | H05K 3/4673 |
| 2020/0176346 | A1* | 6/2020 | Wu | H01L 23/145 |
| 2020/0176378 | A1* | 6/2020 | Wu | H01L 24/17 |
| 2020/0176405 | A1* | 6/2020 | Wu | H01L 23/3107 |
| 2020/0312797 | A1* | 10/2020 | Kang | H01L 23/50 |
| 2020/0343212 | A1* | 10/2020 | Huang | H01L 21/76816 |
| 2021/0035896 | A1* | 2/2021 | Huang | H01L 23/49833 |
| 2021/0035897 | A1* | 2/2021 | Huang | H01L 21/76877 |
| 2021/0068261 | A1* | 3/2021 | Cho | H05K 1/185 |
| 2021/0076492 | A1* | 3/2021 | Min | H05K 1/0393 |
| 2021/0098353 | A1* | 4/2021 | Wu | H01L 23/15 |
| 2021/0098354 | A1* | 4/2021 | Wu | H01L 23/5385 |
| 2021/0118844 | A1* | 4/2021 | Wu | H01L 25/18 |
| 2021/0159200 | A1* | 5/2021 | Lee | H01L 23/49838 |
| 2021/0202353 | A1* | 7/2021 | Jhong | H01L 23/5384 |
| 2021/0225664 | A1* | 7/2021 | Wu | H01L 21/52 |
| 2021/0249756 | A1* | 8/2021 | Cheng | H01L 24/10 |
| 2021/0272889 | A1* | 9/2021 | Wu | H01L 23/49827 |
| 2021/0335726 | A1* | 10/2021 | Wu | H01L 23/562 |
| 2021/0366863 | A1* | 11/2021 | Wu | H01L 25/18 |
| 2021/0366877 | A1* | 11/2021 | Wu | H01L 23/5385 |
| 2021/0407942 | A1* | 12/2021 | Yu | H01L 24/06 |
| 2022/0013463 | A1* | 1/2022 | Wu | H01L 23/49894 |
| 2022/0020655 | A1* | 1/2022 | Cheng | H01L 23/3135 |
| 2022/0020674 | A1* | 1/2022 | Huang | H01L 23/49822 |
| 2022/0068862 | A1* | 3/2022 | Wu | H01L 23/49816 |
| 2022/0069489 | A1* | 3/2022 | Lau | H01L 21/4857 |
| 2022/0262694 | A1* | 8/2022 | Chen | H01L 21/56 |
| 2022/0278036 | A1* | 9/2022 | Wu | H01L 21/4853 |
| 2022/0278066 | A1* | 9/2022 | Wu | H01L 23/3128 |
| 2022/0278087 | A1* | 9/2022 | Wu | H01L 21/4857 |
| 2022/0285331 | A1* | 9/2022 | Wang | H01L 23/66 |
| 2022/0302009 | A1* | 9/2022 | Wu | H01L 23/145 |
| 2022/0302067 | A1* | 9/2022 | Wu | H01L 24/10 |
| 2022/0320019 | A1* | 10/2022 | Chang | H01L 23/642 |
| 2022/0322527 | A1* | 10/2022 | Min | G06F 1/183 |
| 2022/0336335 | A1* | 10/2022 | Wu | H01L 23/49866 |
| 2022/0359324 | A1* | 11/2022 | Lin | H01L 24/11 |
| 2022/0359374 | A1* | 11/2022 | Lin | H01L 23/31 |
| 2022/0367333 | A1* | 11/2022 | Wu | H01L 23/49894 |
| 2023/0060716 | A1* | 3/2023 | Wu | H01L 24/19 |
| 2023/0062146 | A1* | 3/2023 | Wu | H01L 23/481 |

FOREIGN PATENT DOCUMENTS

| | | |
|---|---|---|
| TW | I484600 | 5/2015 |
| TW | I651022 | 2/2019 |
| TW | 202027247 | 7/2020 |

* cited by examiner

CIRCUIT BOARD STRUCTURE AND MANUFACTURING METHOD THEREOF

CROSS-REFERENCE TO RELATED APPLICATION

This application claims the priority benefit of Taiwan application Ser. No. 111102869, filed on Jan. 24, 2022. The entirety of the above-mentioned patent application is hereby incorporated by reference herein and made a part of this specification.

BACKGROUND

Technical Field

The disclosure relates to a circuit board structure and a manufacturing method thereof, and in particular, to a circuit board structure having a redistribution structure with fine circuitries and a manufacturing method thereof.

Description of Related Art

With the development of technology, high-density and multi-layered wiring technology is the mainstream of the development of circuit boards. Currently, most of the wirings on the circuit board are increased by build-up technique. In addition, in order to meet the market demand for high integration and miniaturization of semiconductor devices, the circuit board must provide circuit layouts available for various semiconductor components and must be able to meet the wiring requirements of integrated circuit components with fine circuitries having high density. However, when a fine circuit with high density is formed on a circuit board, the coefficients of thermal expansion (CTE) mismatch among the dielectric material covering the fine circuit, other circuit materials, and the core layer causes the warpage issue of the circuit board during the heating and cooling process as the manufacturing process. This is not conducive to mount the chip on the circuit board. Therefore, how to overcome the problems of poor planarity and low yield of the circuit board has become one of the urgent issues to be solved recently.

SUMMARY

The disclosure is directed to a circuit board structure which may improve the problems of warpage, poor planarity, and low yield of the circuit board structure and the circuit board structure has better reliability.

The disclosure further provides a manufacturing method of a circuit board structure to manufacture the circuit board structure.

The circuit board structure of the disclosure includes a circuit substrate, a redistribution structure, and a dielectric structure. The circuit substrate has having a first side and a second side opposite to each other and includes a first circuit layer disposed at the first side and a second circuit layer disposed at the second side. The redistribution structure is disposed at the first side of the circuit substrate and electrically coupled to the circuit substrate. The redistribution structure includes a first leveling dielectric layer covering the first circuit layer of the circuit substrate, a first thin-film dielectric layer disposed on the first leveling dielectric layer, and a first redistributive layer disposed on the first thin-film dielectric layer and penetrating through the first thin-film dielectric layer and the first leveling dielectric layer to be in contact with the first circuit of the circuit substrate. A material of the first thin-film dielectric layer is different from a material of the first leveling dielectric layer. The dielectric structure is disposed at the second side of the circuit substrate and includes a second leveling dielectric layer disposed below the second circuit layer of the circuit substrate.

In some embodiments of the disclosure, the dielectric structure further includes a second thin-film dielectric layer disposed below the second leveling dielectric layer. A material of the second thin-film dielectric layer is different from a material of the second leveling dielectric layer.

In some embodiments of the disclosure, a maximum thickness of the first thin-film dielectric layer is equal to a maximum thickness of the second thin-film dielectric layer or a difference therebetween is within about ±5%.

In some embodiments of the disclosure, a thickness of the first leveling dielectric layer is greater than a thickness of the first thin-film dielectric layer.

In some embodiments of the disclosure, a line width/spacing of the first redistributive layer of the redistribution structure is finer than a line width/spacing of the first circuit layer of the circuit substrate.

In some embodiments of the disclosure, the redistribution structure further includes a second redistributive layer disposed on the first redistributive layer and electrically coupled to the first redistributive layer. A via portion of the second redistributive layer is finer than a via portion of the first redistributive layer.

The manufacturing method of a circuit board structure includes the following steps. A first leveling dielectric material and a second leveling dielectric material are respectively formed on a first side and a second side of a circuit substrate that are opposite to each other, where the circuit substrate includes a first circuit layer disposed at the first side and a second circuit layer disposed at the second side. A leveling process is respectively performed on the first leveling dielectric material and the second leveling dielectric material, where a thickness of the first leveling dielectric material and a thickness of the second leveling dielectric material are thinned. After the leveling process, a first dielectric thin-film material and a second dielectric thin-film material are respectively formed on the first leveling dielectric material and the second leveling dielectric material, where a thickness of the first dielectric thin-film material is less than a thickness of the second dielectric thin-film material, and the thickness of the second dielectric thin-film material is less than the thickness of the second leveling dielectric material. A portion of the first dielectric thin-film material and a portion of the first leveling dielectric material overlying the portion of the first dielectric thin-film material are removed to form a first thin-film dielectric layer and a first leveling dielectric layer that have a first opening. A first redistributive layer is formed on the first thin-film dielectric layer and in the first opening to be in contact with the first circuit layer at the first side of the circuit substrate.

In some embodiments of the disclosure, after the leveling process, the first circuit layer at the first side of the circuit substrate remains covered by the first leveling dielectric material.

In some embodiments of the disclosure, the leveling process includes a grinding process.

In some embodiments of the disclosure, removing the portion of the first dielectric thin-film material and the portion of the first leveling dielectric material overlying the portion of the first dielectric thin-film material includes forming the first opening through a drilling process.

In some embodiments of the disclosure, the manufacturing method of the circuit board structure further includes forming a third dielectric thin-film material and a fourth dielectric thin-film material respectively on the first redistributive layer and the second dielectric thin-film material; removing a portion of the third dielectric thin-film material to form a third thin-film dielectric layer having a second opening, wherein the second circuit layer at the second side of the circuit substrate remains covered by the second leveling dielectric material; and forming a second redistributive layer on the third thin-film dielectric layer and in the second opening.

In some embodiments of the disclosure, the manufacturing method of the circuit board structure further includes removing a portion of the fourth dielectric thin-film material, a portion of the second dielectric thin-film material overlying the portion of the fourth dielectric thin-film material, and a portion of the second leveling dielectric material overlying the portion of the second dielectric thin-film material to form a fourth thin-film dielectric layer, a second thin-film dielectric layer, and a second leveling dielectric layer that have a third opening, where the third opening exposes at least a portion of the second redistributive layer at the second side of the circuit substrate.

Based on the above, the redistribution structure of the circuit board structure of the disclosure has the redistributive layer that is finer than the circuit layer of the circuit substrate and the redistributive layer has a denser layout density than the circuit layer of the circuit substrate, such that a chip having fine-pitched conductive terminals may be directly mounted on the redistribution structure of the circuit board structure. In addition, by forming the leveling dielectric layer on the circuit substrate of the circuit board structure and then forming the redistributive layer on the leveling dielectric layer, the conductive pads on the circuit substrate will not be affected by the leveling process and will not result in cracking or burring, and the total thickness variation of the resulting structure may also be reduced in order to facilitate the subsequent fabrication of the redistribution layer that requires higher planarity. Furthermore, while the redistribution structure is formed on one side of the circuit substrate of the circuit board structure, a certain number of layers (or a corresponding number of layers) of dielectric thin-film material is formed on the opposite side of the circuit substrate. This may suppress the warpage of the overall structure and help to improve the electrical performance and reliability of the circuit board structure.

In order to make the aforementioned features and advantages of the disclosure comprehensible, embodiments accompanied with drawings are described in detail below.

DESCRIPTION OF THE EMBODIMENTS

Figure 1A:
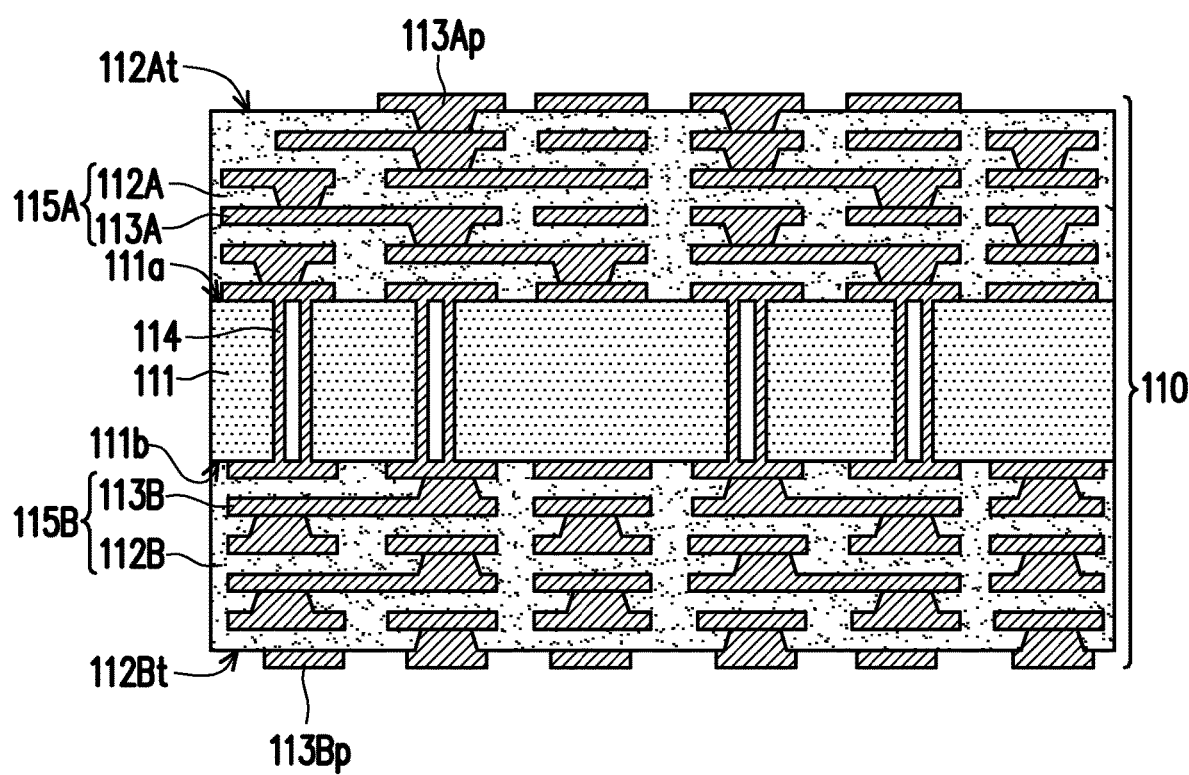
FIG. 1A to FIG. 1J are schematic cross-sectional views of a manufacturing method of a circuit board structure according to some embodiments of the disclosure.

FIG. 1A to FIG. 1J are schematic cross-sectional views of a manufacturing method of a circuit board structure according to some embodiments of the disclosure. Referring to FIG. 1A, a circuit substrate 110 is provided. The circuit substrate 110 may be a single-layered circuit substrate, a double-layered circuit substrate, or a multi-layered circuit substrate. In some embodiments, the circuit substrate 110 may include a core layer 111, a first dielectric layer 112A and a second dielectric layer 112B respectively formed on the core layer 111, a first circuit layer 113A and a second circuit layer 113B respectively formed on/in the first dielectric layer 112A and the second dielectric layer 112B, and conductive through core vias 114 penetrating through the core layer 111 to be in contact with the first circuit layer 113A and the second circuit layer 113B. For example, the core layer 111 has a first side 111a and a second side 111b opposite to each other, the first dielectric layer 112A and the first circuit layer 113A are formed on the first side 111a of the core layer 111 and may be collectively viewed as a first circuit structure 115A, while the second dielectric layer 112B and the second circuit layer 113B are formed on the second side 111b of the core layer 111 and may be collectively viewed as a second circuit structure 115B.

The material of the core layer 111 may be a dielectric material which is harder than material(s) of the first dielectric layer 112A and/or the second dielectric layer 112B to serve as a structural support for the overall circuit substrate 110. The core layer 111 may be a single dielectric material or a stack of multiple different dielectric materials. The material and number of layers of the first dielectric layer 112A on the first side 111a may be substantially the same as those of the second dielectric layer 112B on the second side 111b. In some embodiments, the first dielectric layer 112A and the second dielectric layer 112B may use different dielectric materials and/or may have different number of layers. The material and the number of layers of the first circuit layer 113A on the first side 111a may be substantially the same as those of the second circuit layer 113B on the second side 111b, or may use different conductive materials and/or have different number of layers. The number of layers of the first circuit layer 113A and the second circuit layer 113B are not limited in the disclosure. Each of the first circuit layer 113 and the second circuit layer 113B may include conductive lines, conductive vias, conductive pads, etc. In some embodiments, a portion of the first circuit layer 113A (e.g., the first conductive pads 113Ap) and a portion of the second circuit layer 113B (e.g., the second conductive pads 113Bp) may be respectively formed on the outer surface 112At of the first dielectric layer 112A and the outer surface 112Bt of the second dielectric layer 112B for further electrical connection.

Two ends of the respective conductive through core via 114 may be respectively in direct contact with and electrically coupled to the first circuit layer 113A and the second circuit layer 113B to provide vertical electrical conduction on two opposite sides of the core layer 111. In the illustrated embodiment, the conductive through core vias 114 are hollow. In other embodiments, the conductive through core vias 114 may be solid and plated conductive pillars or the insulating material coated with the conductive layer. It should be understood that the circuit substrate 110 illustrated in FIG. 1A is merely an illustrative example, the circuit substrate of the disclosure may have more (or less) component than the circuit substrate 110 and construes no limitation.

Figure 1B:
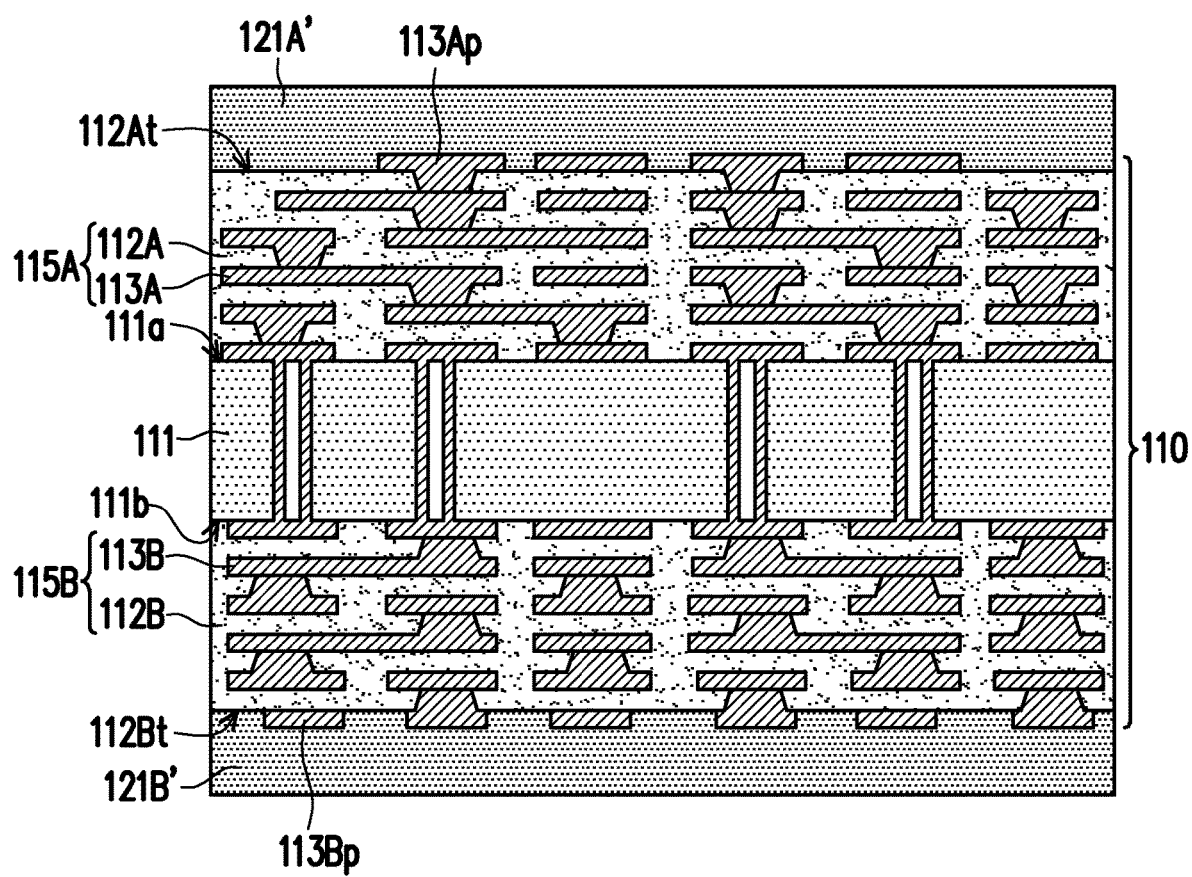

Referring to FIG. 1B, a first leveling dielectric material 121A' and a second leveling dielectric material 121B' are respectively formed on the first dielectric layer 112A and the second dielectric layer 112B. For example, the first leveling dielectric material 121A' and the second leveling dielectric material 121B' may be a material including insulating resins and inorganic fillers (e.g., Ajinomoto Build-up Film (ABF)) or other suitable dielectric material, and may be formed by using a lamination process or other suitable deposition process. The first conductive pads 113Ap may be embedded in the first leveling dielectric material 121A' formed on the outer surface 112At of the first dielectric layer 112A. Similarly, the second conductive pads 113Bp may also be embedded in the second leveling dielectric material 121B' formed on the outer surface 112Bt of the second dielectric layer 112B.

Figure 1C:
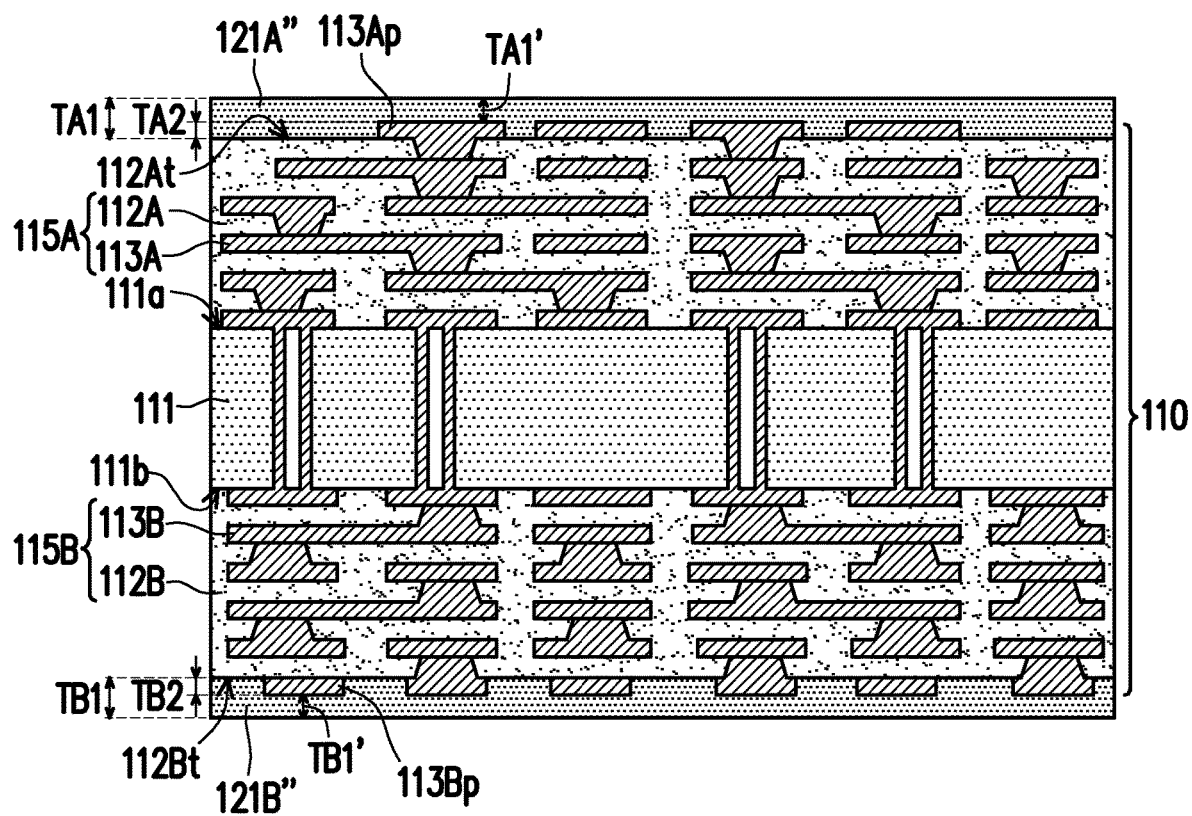

Referring to FIG. 1C and with reference to FIG. 1B, a leveling process is performed on the first leveling dielectric material 121A' and the second leveling dielectric material 121B', respectively. The leveling process may be or may include grinding process or other suitable thinning/planarizing process. After the leveling process, the planarized first leveling dielectric material 121A" and the planarized second leveling dielectric material 121B" are respectively formed. After the leveling process, the first conductive pads 113Ap are still buried in the planarized first leveling dielectric material 121A" without being exposed, and the second conductive pads 113Bp are still buried in the planarized second leveling dielectric material 121B" without being exposed. The maximum thickness TA1 of the planarized first leveling dielectric material 121A" is greater than a thickness TA2 of the respective first conductive pad 113Ap on the first dielectric layer 112A, and the maximum thickness TB1 of the planarized second leveling dielectric material 121B" is greater than a thickness TB2 of the respective second conductive pad 113Bp on the second dielectric layer 112B. In some embodiments, a portion of the planarized first leveling dielectric material 121A" formed directly over the first conductive pad 113Ap has a thickness TA1', where the value of the thickness TA1' is non-zero. A portion of the planarized second leveling dielectric material 121B" formed directly over the second conductive pad 113Bp has a thickness TB1', where the value of the thickness TB1' is also non-zero.

By respectively forming the planarized first leveling dielectric material 121A" and the planarized second leveling dielectric material 121B" at two opposing sides of the circuit substrate 110, the total thickness variation (TTV) of the resulting structure may be reduced in order to facilitate the subsequent fabrication of the redistribution layer that requires higher planarity. In addition, by forming the planarized first leveling dielectric material 121A" and the planarized second leveling dielectric material 121B" to meet the requirement of reducing the total thickness variation value, the first circuit layer 113A and the second circuit layer 113B of the circuit substrate 110 are not affected by the grinding process or other planarizing process resulting in burring or cracking, so as to maintain its integrity.

Figure 1D:
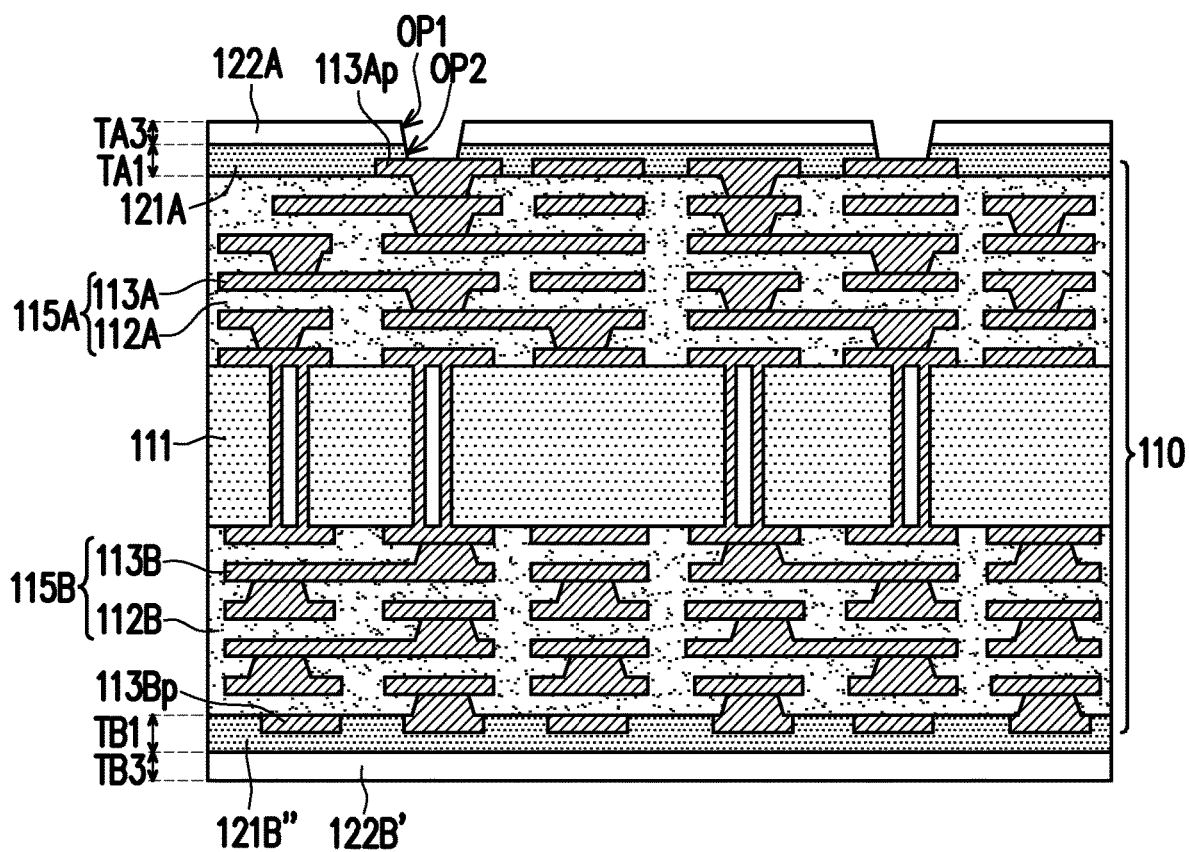

Referring to FIG. 1D and with reference to FIG. 1C, a dielectric material is respectively formed on the planarized first leveling dielectric material 121A" and the planarized second leveling dielectric material 121B", where the dielectric material may be or may include photo-imageable dielectric (PID) or other materials suitable for thin-circuitry dielectric layers, and may be formed by using, for example, lamination or other suitable deposition process. Next, a portion of the dielectric material formed on the planarized first leveling dielectric material 121A" and the planarized first leveling dielectric material 121A" underlying the portion of the dielectric material are removed to respectively form a first thin-film dielectric layer 122A and a first leveling dielectric layer 121A. For example, a drilling process is performed on the dielectric material formed on the planarized first leveling dielectric material 121A" and the planarized first leveling dielectric material 121A" to form the first thin-film dielectric layer 122A with openings OP1 and the first leveling dielectric layer 121A with the corresponding openings OP2, where these openings OP1 and OP2 collectively expose at least a part of the first conductive pads 113Ap to facilitate subsequent electrical connection.

For example, the maximum thickness TA1 of the first leveling layer 121A is greater than the maximum thickness TA3 of the first thin-film dielectric layer 122A, and the maximum thickness TB1 of the planarized second leveling dielectric material 121B" is greater than the maximum thickness TB3 of the second dielectric thin-film material 122B'. The second dielectric thin-film material 122B' formed on the planarized second leveling dielectric material 121B" then remains covering the planarized second leveling dielectric material 121B", and the drilling process is not performed at this stage. In some embodiments, the maximum thickness TA1 of the first leveling dielectric layer 121A and the maximum thickness TB1 of the planarized second leveling dielectric material 121B" are equal, or the difference between the maximum thicknesses TA1 and TB1 is within about ±5%. In some embodiments, the maximum thickness TA3 of the first thin-film dielectric layer 122A and the maximum thickness TB3 of the second dielectric thin-film material 122B' are equal, or the difference between the maximum thicknesses TA3 and TB3 is within about ±5%. By configuring the respective dielectric layers formed on the two opposite sides of the circuit substrate 110 to have equal or similar thicknesses, such symmetrical configuration may reduce warpage issues caused by the CTE mismatches during fabrication.

Figure 1E:
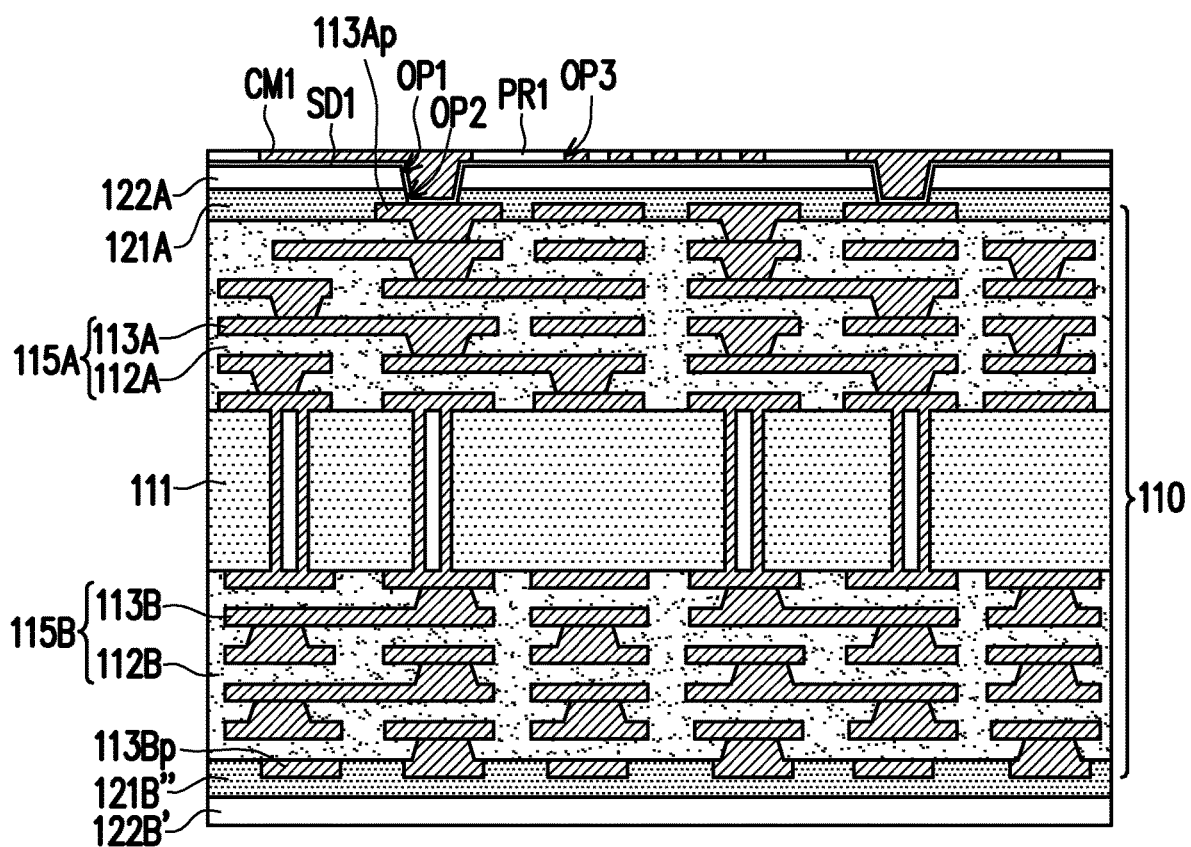

Referring to FIG. 1E, a seed layer SD1 may be conformally formed on the first thin-film dielectric layer 122A by using, for example, sputtering process or other suitable deposition process. The seed layer SD1 may be formed on the upper surface of the first thin-film dielectric layer and formed in the openings OP1 and OP2 to be in direct contact with the first conductive pads 113Ap that are exposed by the openings OP1 and OP2. Next, a patterned photoresist layer PR1 may be formed on the seed layer SD1 using lithography process, where the patterned photoresist layer PR1 has openings OP3 to expose a portion of the seed layer SD1. Subsequently, a conductive material CM1 is formed in the openings OP3 of the patterned photoresist layer PR1 and formed on the seed layer SD1 exposed by the patterned photoresist layer PR1 by using, for example, plating process or other suitable deposition process.

Figure 1F:
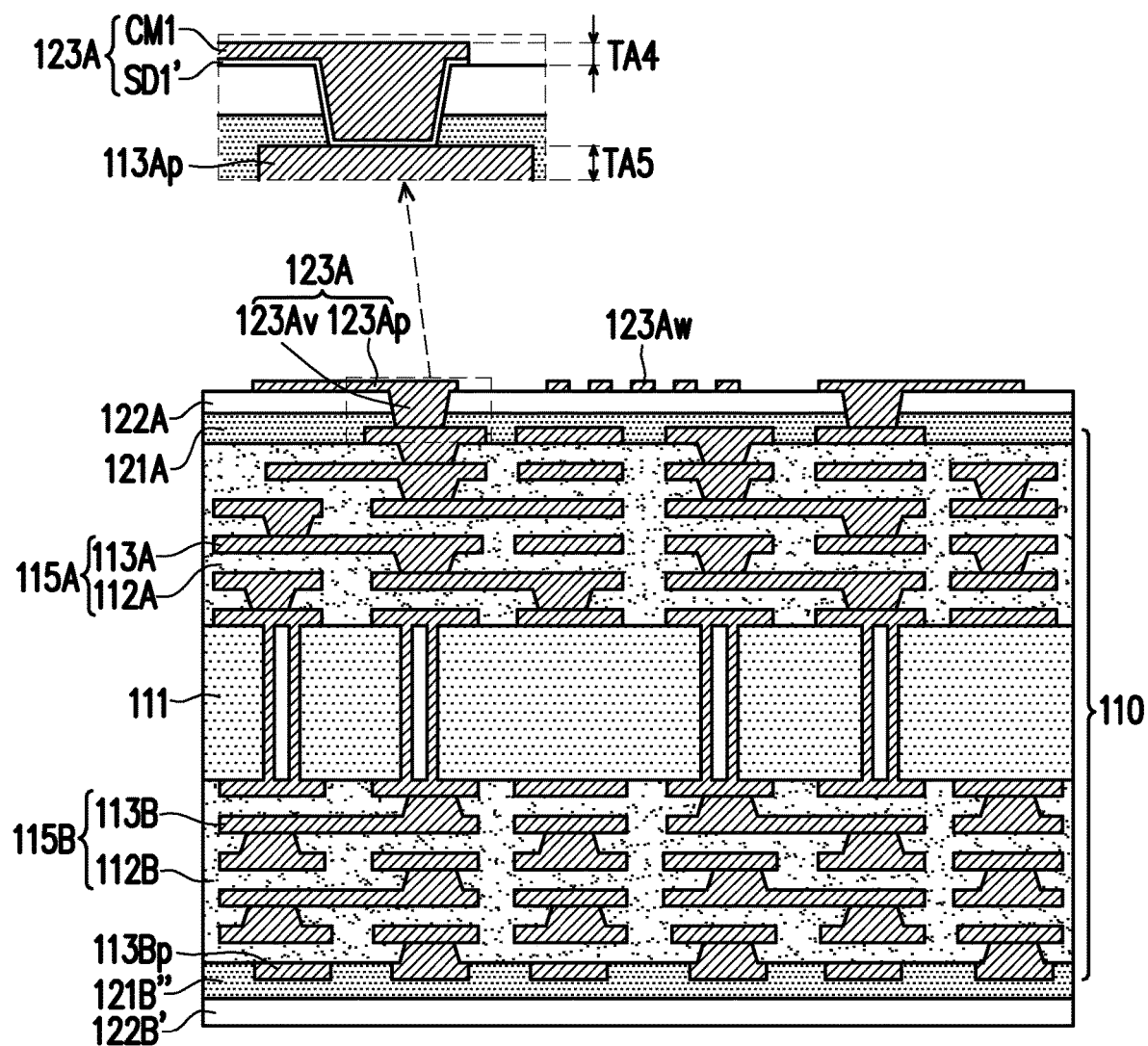

Referring to FIG. 1F and with reference to FIG. 1E, after forming the conductive material CM1, the patterned photoresist layer PR1 may be removed by suitable process. Next, a portion of the seed layer SD1 that is not covered by the conductive material CM1 may be removed by suitable process to form a first redistributive layer 123A. As the enlarged view in FIG. 1F, the first redistributive layer 123A includes the conductive material CM1 and the underlying patterned seed layer SD1'. In some embodiments, the first redistributive layer 123A has via portions 123Av connected to the first conductive pads 113Ap, pad portions 123Ap connected to the via portions 123Av, and line portions 123Aw connected to the pad portions 123Ap, where the pad portions 123Ap and the line portions 123Aw are disposed on the upper surface of the first thin-film dielectric layer 122A, the via portions 123Av are laterally and directly covered by the first thin-film dielectric layer 122A and the underlying first leveling dielectric layer 121A. In some embodiments, the line width/spacing of the first redistributive layer 123A is finer than the line width/spacing of the first circuit layer 113A. For example, one of thickness TA4 of the pad portions 123Ap and the line portions 123Aw disposed on the upper surface of the first thin-film dielectric layer 122A is less than the thickness TA5 of the respective first conductive pad 113Ap formed on the first dielectric layer 112A.

Figure 1G:
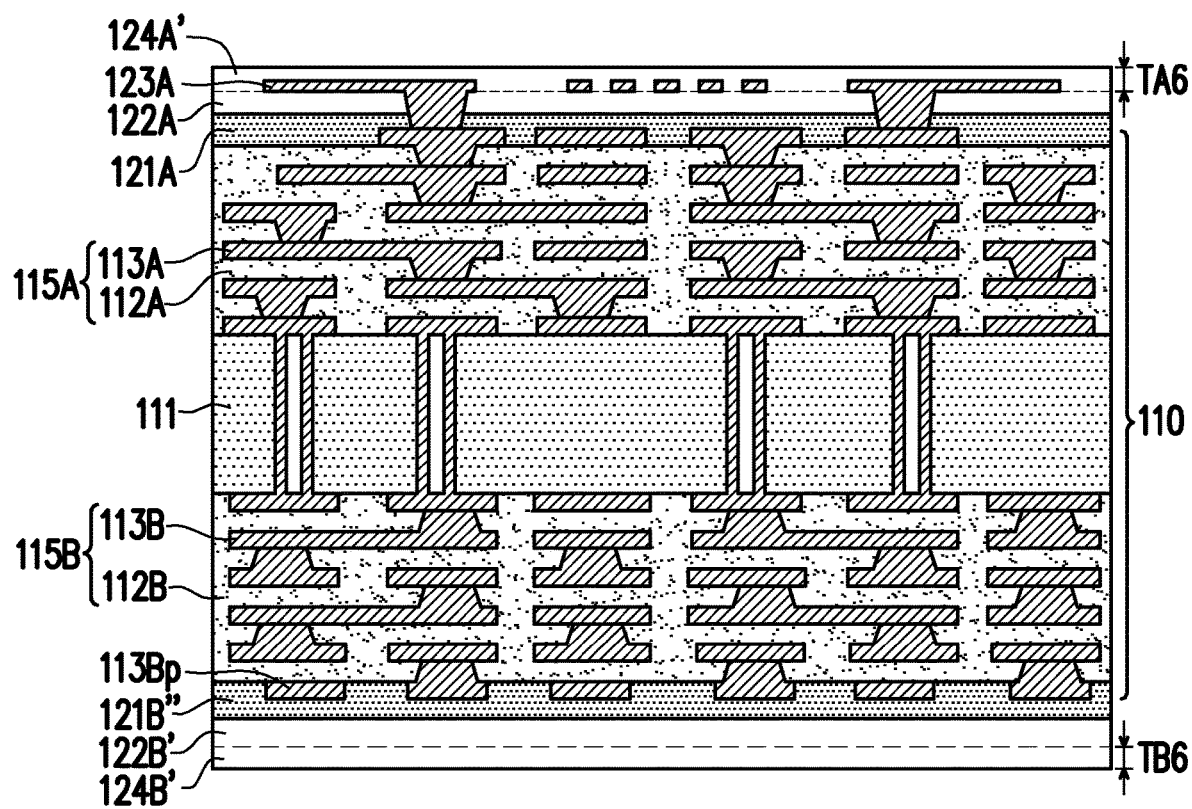

Referring to FIG. 1G, a third dielectric thin-film material 124A' and a fourth dielectric thin-film material 124B' are respectively formed on the first thin-film dielectric layer 122A and the second dielectric thin-film material 122B' by using lamination process or other suitable deposition process. The third dielectric thin-film material 124A' may cover the first redistributive layer 123A formed on the first thin-film dielectric layer 122A. For example, material(s) of the third dielectric thin-film material 124A' and the fourth dielectric thin-film material 124B' may be the same as or similar to that of the first thin-film dielectric layer 122A and the second dielectric thin-film material 122B', and thus an interface between the first thin-film dielectric layer 122A and the third dielectric thin-film material 124A' and an interface between the second dielectric thin-film material 122B' and the fourth dielectric thin-film material 124B' may (or may not) exist; therefore, the dashed lines are used to indicate those interfaces may (or may not) exist. In some embodiments, the maximum thickness TA6 of the third dielectric thin-film material 124A' and the maximum thickness TB6 of the fourth dielectric thin-film material 124B' are equal, or the difference between the maximum thicknesses TA6 and TB6 is within about ±5%.

Figure 1H:
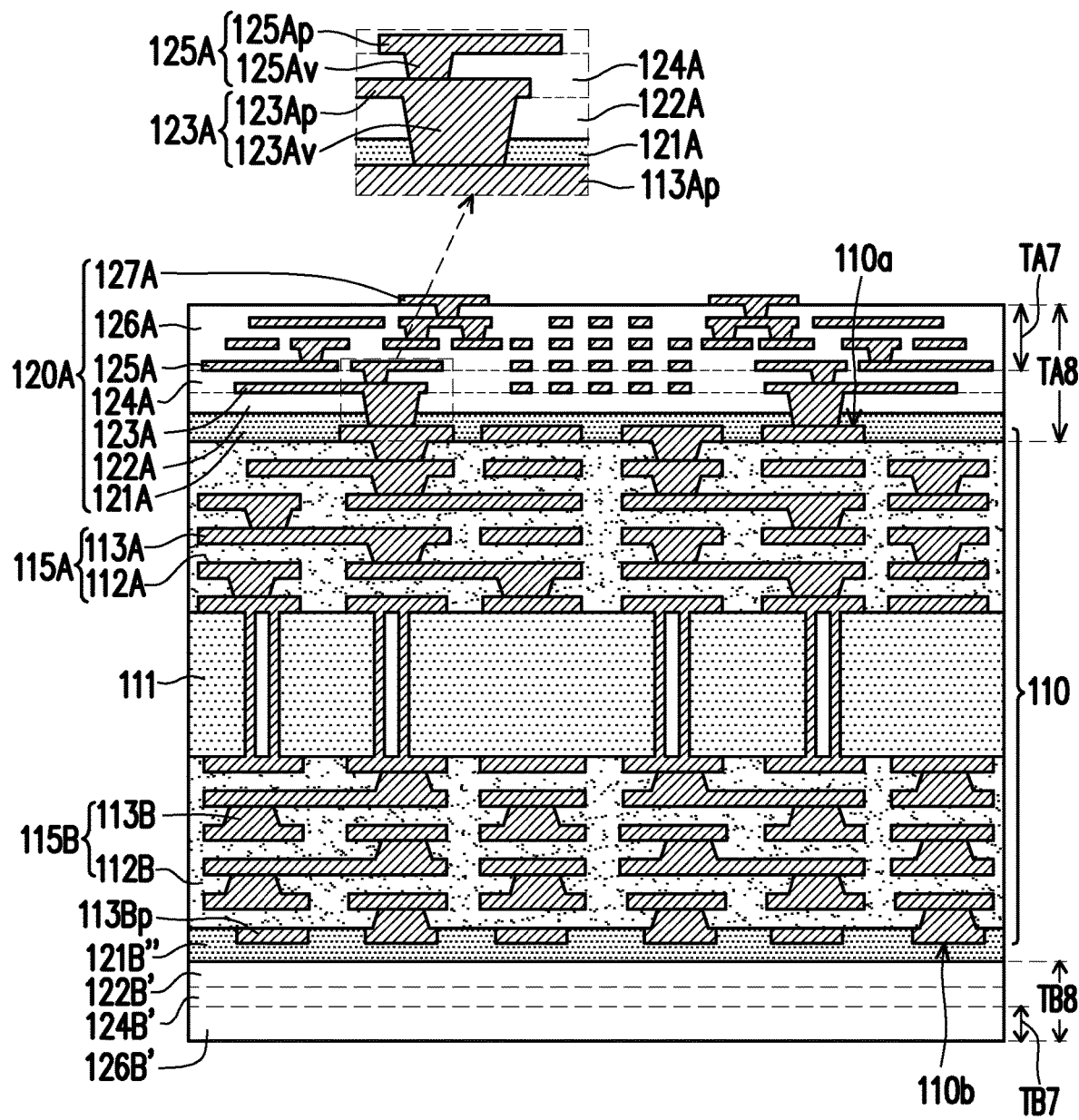

Referring to FIG. 1H and with reference to FIG. 1G, a portion of the third dielectric thin-film material 124A' is removed to form a third thin-film dielectric layer 124A within openings, where the openings of the third thin-film dielectric layer 124A expose a portion of the first redistributive layer 123A to facilitate the subsequent electrical connection. The third thin-film dielectric layer 124A is formed with the openings at the predetermined positions by lithography and etching process or other suitable removal process. Next, a second redistributive layer 125A may be formed on the third thin-film dielectric layer 124A. The forming process of the second redistributive layer 125A may be similar to that of the first redistributive layer 123A, and thus the details are not repeated herein. As the enlarged view in FIG. 1H, the second redistributive layer 125A includes via portions 125Av connected to the pad portions 123Ap of the first redistributive layer 123A and pad portions 125Ap connected to the via portions 125Av. In some embodiments, the via portions 125Av of the second redistributive layer 125A are finer (e.g., the height and the width are less) than the via portions 123Av of the first redistributive layer 123A. The pad portions 125Ap of the second redistributive layer 125A and the pad portions 123Ap of the first redistributive layer 123A may be thinner than the thickness of the first conductive pads 113Ap of the circuit substrate 110. For example, the second redistributive layer 125A may be referred to as a fine circuitry and the circuit layer 113A of the circuit substrate 110 may be referred to as a coarse circuitry.

Subsequently, a fifth thin-film dielectric layer 126A may be formed on the third thin-film dielectric layer 124A and a sixth thin-film dielectric material 126B' may be formed on the fourth dielectric thin-film material 124B'. The material of the fifth thin-film dielectric layer 126A may be the same as or similar to the material of the underlying third thin-film dielectric layer 124A, and the fourth dielectric thin-film material 124B' and the sixth thin-film dielectric material 126B' may also be the same or similar materials; therefore, the dashed lines are used to indicate the interfaces therebetween. In some embodiments, the maximum thickness TA7 of the fifth thin-film dielectric layer 126A and the maximum thickness TB7 of the sixth thin-film dielectric layer 126B' are equal, or the difference between the maximum thicknesses TA7 and TB7 is within about ±5%. In some embodiments, the maximum thickness TA8 of all of the first thin-film dielectric layer 122A, the third thin-film dielectric layer 124A, and the fifth thin-film dielectric layer 126A is equal to the maximum thickness TB8 of all of the second dielectric thin-film material 122B', the fourth dielectric thin-film material 124B', and the sixth dielectric thin-film material 126B', or the difference between the maximum thicknesses TA8 and TB8 is within about ±5%. When the redistribution structure is fabricated on the first side 110a of the circuit substrate 110, a certain number of layers (or corresponding layers) of dielectric thin-film materials are also stacked on the second side 110b of the circuit substrate 110 at the same time, and the respective dielectric layers on these two of the first side 110a and the second side 110b are designed to have equal or similar thicknesses. Such a symmetrical configuration may effectively reduce the warpage issues caused by the CTE mismatches when forming the dielectric thin-film material of the redistribution structure. Further, when the redistribution structure is fabricated, the overall structure may still maintain certain planarity, thereby improving the electrical performance of the redistribution structure.

In some embodiments, the fifth thin-film dielectric layer 126A may have openings to expose a portion of the second redistributive layer 125A to facilitate the subsequent electrical connection. The forming process of the fifth thin-film dielectric layer 126A may be similar to that of the third thin-film dielectric layer 124A, and thus the details are not repeated herein. More thin-film dielectric layers and more redistributive layers may be formed in/on the fifth thin-film dielectric layer 126A by the way of forming the second redistributive layer 125A and the third thin-film dielectric layer 124A. More layers of dielectric thin-film material may also be stacked on the sixth dielectric thin-film material 126B'. For example, the same number of thin-film dielectric layers as those on the first side 110a of the circuit substrate 110 may be stacked on the second side 110b of the circuit substrate 110, or thin-film dielectric layers are stacked on the second side 110b of the circuit substrate 110 in a slightly smaller number than that on the first side 110a of the circuit substrate 110. It should be understood that FIG. 1H is merely an example; the number of layers of the thin-film dielectric layer and the redistributive layer are not limited in the disclosure which may be increased or decreased depending on the requirements of circuit design. In some embodiments, as shown in FIG. 1H, a top redistributive layer 127A (e.g., including conductive pads) may be formed on the fifth thin-film dielectric layer 126A for electrical connection to a chip (not shown) having fine-pitched conductive terminals.

For example, the first leveling dielectric layer 121A, the first thin-film dielectric layer 122A, the first redistributive layer 123A, the third thin-film dielectric layer 124A, the second redistributive layer 125A, the fifth thin-film dielectric layer 126A, and the top redistributive layer 127A that are disposed on the first side 110a of the circuit substrate 110 may be collectively referred to as a redistribution structure 120A. As compared to the first circuit structure 115A of the circuit substrate 110 underlying and connected to the redistribution structure 120A, the overall thickness of the redistribution structure 120A is thinner than the overall thickness of the first circuit structure 115A. The distribution density per unit area of each redistributive layer in the redistribution structure 120A is denser than the distribution density per unit area of one of the circuit layer in the first circuit structure 115A, and the line width/spacing of each redistributive layer in the redistribution structure 120A is finer than that of the one of the circuit layer in the first circuit structure 115A. Such configuration facilitates electrical connection of the redistribution structure 120A to a chip (not shown) with fine-pitched conductive terminals.

Figure 1I:
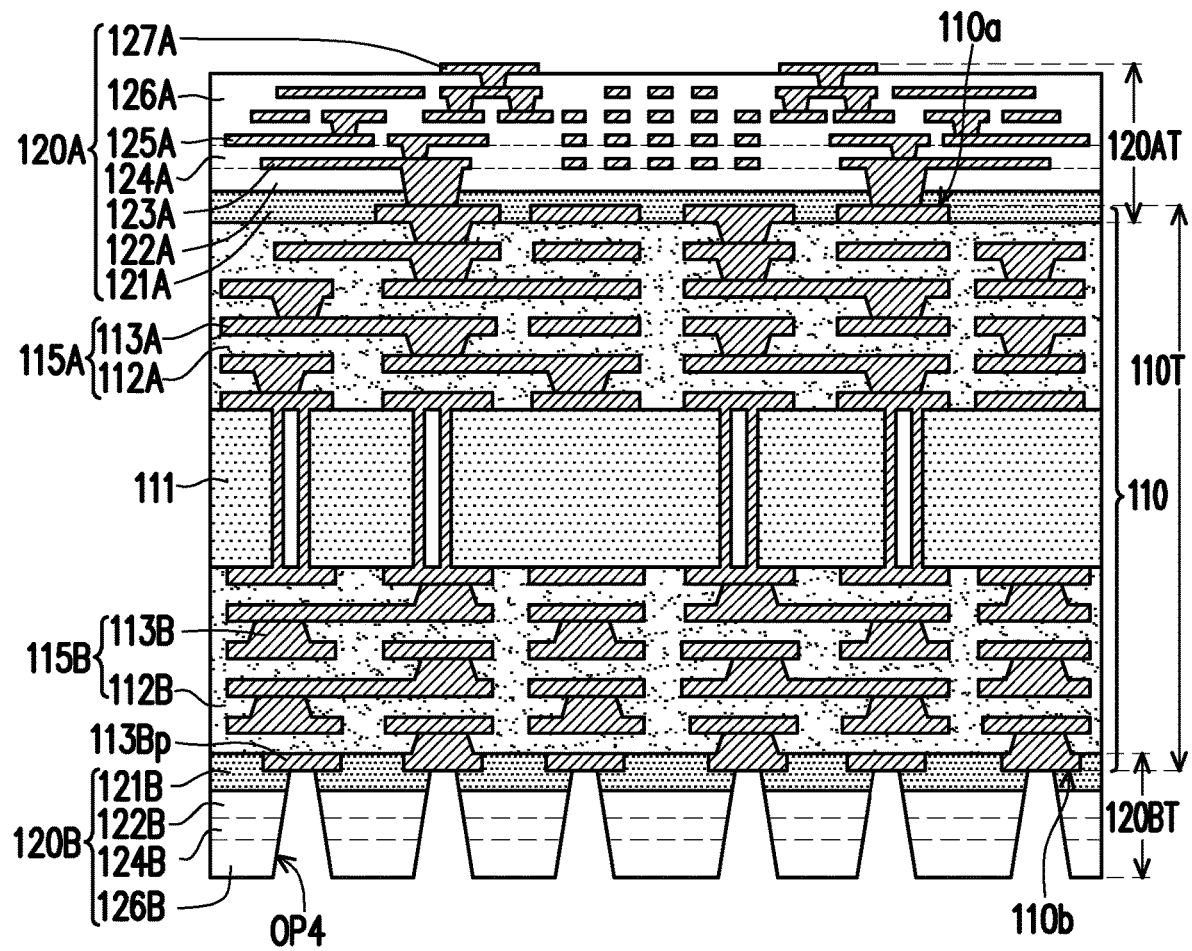

Referring to FIG. 1I and with reference to FIG. 1H, portions of the planarized second leveling dielectric material 121B", the second dielectric thin-film material 122B', the fourth dielectric thin-film material 124B', and the sixth dielectric thin-film material 126B' are removed to respectively form a second leveling dielectric layer 121B, a second thin-film dielectric layer 122B, a fourth thin-film dielectric layer 124B, and a sixth thin-film dielectric layer 126B that have openings OP4. The second leveling dielectric layer 121B, the second thin-film dielectric layer 122B, the fourth thin-film dielectric layer 124B, and the sixth thin-film dielectric layer 126B may be collectively referred to as a dielectric structure 120B, where the dielectric structure 120B may be free of conductive wirings. For example, a drilling process, an etching process, a combination thereof, or other suitable removal processes may be used to form the openings OP4 which penetrate through the respective dielectric materials on the second side 110b of the circuit substrate 110, where the openings OP4 expose at least a part of the second conductive pads 113Bp for the subsequent electrical connection. In some embodiments, the maximum thickness 110T of the circuit substrate 110 is thicker than the maximum thickness 120AT of the redistribution structure 120A, and the maximum thickness 120AT of the redistribution structure 120A is thicker than the maximum thickness 120BT of the dielectric structure 120B. It should be understood that the thickness of each structure may be adjusted according to product requirements, which is not limited thereto.

Figure 1J:
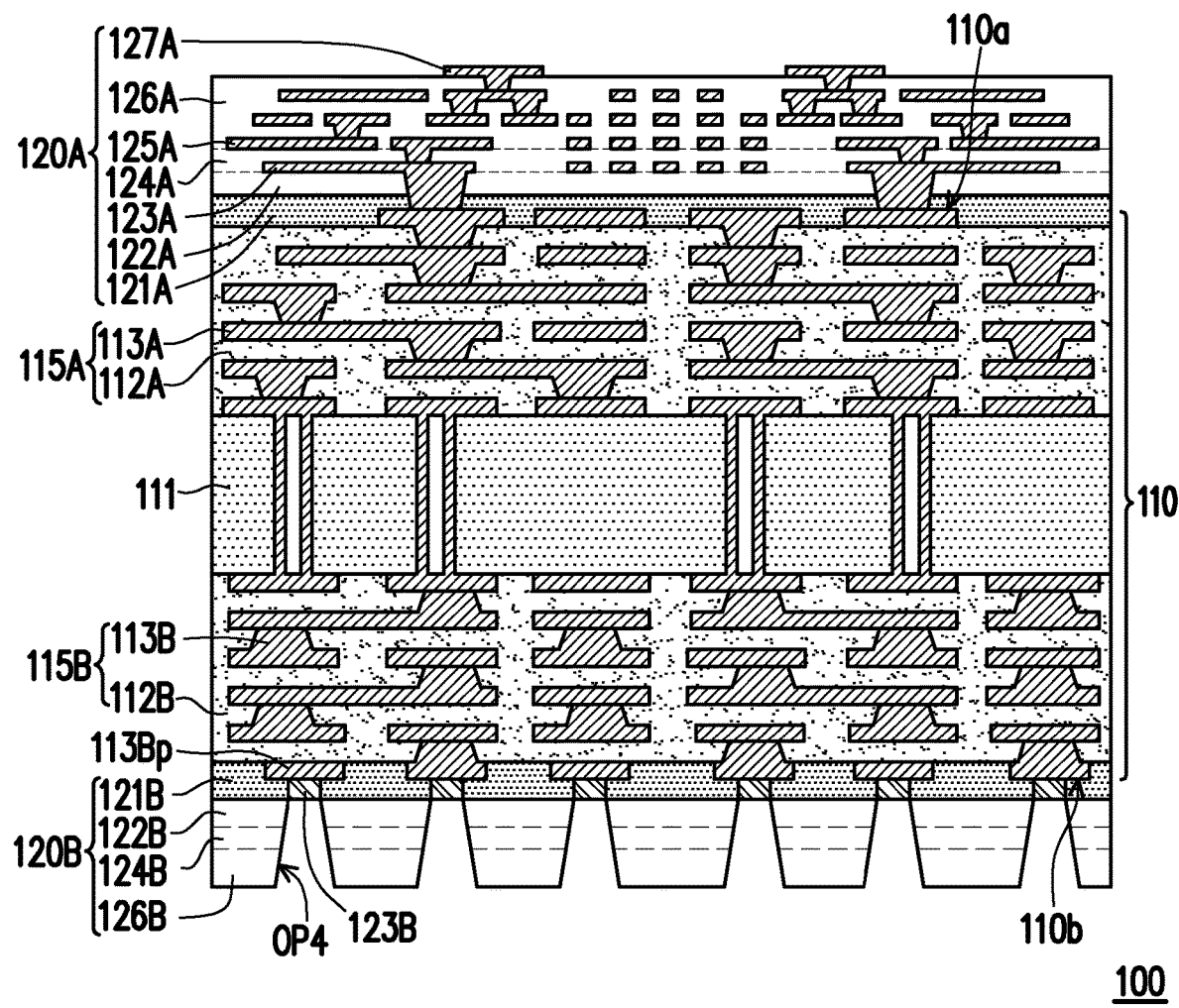

Referring to FIG. 1J, a surface finishing layer 123B is formed on the second conductive pads 113Bp exposed by the openings OP4 of the dielectric structure 120B to form conductive terminals (not shown; such as solder balls) thereon. The surface finishing layer 123B may include a thin film formed by utilizing an electroless-nickel-palladium-immersion-gold (ENEPIG) technique to increase bonding reliability between the subsequently-formed conductive terminals. Other suitable processes may also be used to form the surface finishing layer 123B. It is worth to mention that the dielectric structure 120B may be directly used as a solder resist layer, so there is no need to form an additional solder resist layer before forming the conductive terminals. Up to here, the fabrication of the circuit board structure 100 is substantially completed.

In summary of the above, the circuit board structure of the disclosure includes circuit substrate, and the redistribution structure and the dielectric structure are respectively formed on two opposing sides of the circuit substrate, where the redistribution structure has a finer and denser redistributive layer than the circuit layer of the circuit substrate to have the chips with fine-pitched conductive terminals directly mounted on the redistribution structure of the circuit board structure. In addition, by forming the leveling dielectric layer on the circuit substrate of the circuit board structure and then forming the redistributive layer thereon, the conductive pads on the circuit substrate will not be affected by the leveling process and will not result in cracking or burring. Meanwhile, the total thickness variation of the resulting structure may also be reduced to facilitate the subsequent fabrication of the redistribution layer that requires higher planarity. Furthermore, while the redistribution structure is formed on one side of the circuit substrate, a certain number of layers (or a corresponding number of layers) of dielectric thin-film material is formed on the opposite side of the circuit substrate. This may suppress the warpage of the overall structure and help to improve the electrical performance and reliability of the circuit board structure.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A circuit board structure, comprising:
    a circuit substrate, having a first side and a second side opposite to each other, and comprising a first circuit layer disposed at the first side and a second circuit layer disposed at the second side;
    a redistribution structure, disposed at the first side of the circuit substrate and electrically coupled to the circuit substrate, the redistribution structure comprising:
        a first leveling dielectric layer, covering the first circuit layer of the circuit substrate;
        a first thin-film dielectric layer, disposed on the first leveling dielectric layer, a material of the first thin-film dielectric layer being different from a material of the first leveling dielectric layer; and
        a first redistributive layer, disposed on the first thin-film dielectric layer, wherein the first redistributive layer comprises:
            a pad portion disposed on and in direct contact with an upper surface of the first thin-film dielectric layer; and
            a via portion disposed between and in direct contact with the pad portion and the first circuit layer, wherein the via portion penetrates through the first thin-film dielectric layer and the first leveling dielectric layer such that the via portion is laterally and directly covered by the first thin-film dielectric layer and the first leveling dielectric layer;
        a second redistributive layer, disposed on the pad portion of the first redistributive layer and electrically coupled to the first redistributive layer, a via portion of the second redistributive layer being finer than the via portion of the first redistributive layer; and
    a dielectric structure, disposed at the second side of the circuit substrate and comprising a second leveling dielectric layer disposed below the second circuit layer of the circuit substrate.

2. The circuit board structure of claim 1, wherein the dielectric structure further comprises:
    a second thin-film dielectric layer, disposed below the second leveling dielectric layer, a material of the second thin-film dielectric layer being different from a material of the second leveling dielectric layer.

3. The circuit board structure of claim 2, wherein a maximum thickness of the first thin-film dielectric layer is equal to a maximum thickness of the second thin-film dielectric layer or a difference therebetween is within about ±5%.

4. The circuit board structure of claim 1, wherein a thickness of the first leveling dielectric layer is greater than a thickness of the first thin-film dielectric layer.

5. The circuit board structure of claim 1, wherein a line width/spacing of the first redistributive layer of the redistribution structure is finer than a line width/spacing of the first circuit layer of the circuit substrate.

6. The circuit board structure of claim 1, wherein except for areas where the via portion penetrates through the first thin-film dielectric layer and the first leveling dielectric layer, a bottom surface of the first thin-film dielectric layer is completely and directly attached to a top surface of the first leveling dielectric layer.

* * * * *